United States Patent
Yang

(10) Patent No.: US 8,220,151 B2
(45) Date of Patent: Jul. 17, 2012

(54) HEAT PIPE AND METHOD FOR MANUFACTURING THE SAME

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 916 days.

(21) Appl. No.: 12/168,907

(22) Filed: Jul. 8, 2008

(65) Prior Publication Data

US 2010/0006266 A1    Jan. 14, 2010

(51) Int. Cl.
*B23P 6/00* (2006.01)
(52) U.S. Cl. .............. 29/890.032; 29/890.053
(58) Field of Classification Search ............. 29/890.03, 29/890.032, 890.043, 890.045, 890.053, 29/890.054, 33 T; 165/80.1, 104.26, 133, 165/DIG. 515; 72/369, 370.16–370.21
See application file for complete search history.

(56) References Cited

U.S. PATENT DOCUMENTS

| | | | |
|---|---|---|---|
| 4,175,419 A * | 11/1979 | Mabery | 72/383 |
| 6,321,452 B1 * | 11/2001 | Lin | 29/890.032 |
| 6,830,098 B1 * | 12/2004 | Todd et al. | 165/104.33 |
| 7,237,338 B2 * | 7/2007 | Lin et al. | 29/890.032 |
| 7,866,376 B2 * | 1/2011 | Jiang et al. | 165/104.33 |
| 2003/0141041 A1 * | 7/2003 | Chen | 165/80.3 |
| 2006/0174484 A1 * | 8/2006 | Chuang et al. | 29/890.032 |
| 2007/0163770 A1 * | 7/2007 | Liu et al. | 165/185 |
| 2007/0221365 A1 * | 9/2007 | Martin et al. | 165/150 |
| 2008/0055857 A1 * | 3/2008 | Chen et al. | 361/703 |

FOREIGN PATENT DOCUMENTS

| | | |
|---|---|---|
| CN | 1065521 A | 10/1992 |
| CN | 2650333 Y | 10/2004 |
| CN | 101118135 A | 2/2008 |

* cited by examiner

*Primary Examiner* — David Bryant
*Assistant Examiner* — Ryan J Walters
(74) *Attorney, Agent, or Firm* — Altis Law Group, Inc.

(57) ABSTRACT

A heat pipe includes an evaporation section, a condensation section and a connecting section connecting with the evaporation section and the condensation section. The evaporation section defines a plurality of dents at an outer wall thereof to increase rough degree of the outer wall of the evaporation section. The dents are provided to prevent solder from separation from the evaporation section during soldering process soldering the evaporation section to a heat sink.

11 Claims, 3 Drawing Sheets

HEAT PIPE AND METHOD FOR MANUFACTURING THE SAME

BACKGROUND OF THE INVENTION

1. Field of the Invention

The present invention relates to a heat pipe for cooling an electronic component, and more particularly to a method for manufacturing the heat pipe, wherein outer surface of the heat pipe has dents defined therein.

2. Description of Related Art

Electronic components, such as central processing units (CPUs) comprise numerous circuits operating at high speed and generating substantial heat. Under most circumstances, it is necessary to cool the CPUs in order to maintain safe operating conditions and assure that the CPUs function properly and reliably. In the past, various approaches have been used to cool electronic components. Typically, a finned metal heat sink is attached to an outer surface of the CPU to remove the heat therefrom. The heat absorbed by the heat sink is then dissipated to ambient air. The related finned metal heat sink is made of highly heat-conductive metal, such as copper or aluminum, and generally comprises a base for contacting the CPU to absorb the heat therefrom and a plurality of fins formed on the base for dissipating the heat. However, as the operating speed of electronic components has increased markedly in recent years, such a related heat sink, which transfers the heat only by metal conduction, is not competent for dissipating so much heat any more. The heat of the bottom of the metal heat sink can not be transferred to the whole heat dissipation device quickly, and especially can not be transferred to the fins far away from the bottom of the metal heat sink.

Heat pipes, which operate by phase change of working liquid sealed in a hollow pipe, have been widely used due to their excellent heat transfer properties. Accordingly, heat sinks equipped with heat pipes are devised in various manners and widely used. In this related art, each heat pipe has an evaporation section soldered in a base of the heat sink and a condensation section soldered into fins of the heat sink. However, during the soldering process of the heat pipe and the base of the heat sink, the outer surface of the heat pipe is too smooth to enable the molten solder to adhere thereon, whereby the molten solder can flow away from the heat pipe; thus, a thermal connection between the heat pipe and the base is adversely affected and a heat dissipation capability of the heat sink is accordingly reduced.

A solution for preventing molten solder from flowing away from a heat pipe during the soldering process for soldering the heat pipe to a heat sink is needed.

SUMMARY OF THE INVENTION

A heat pipe includes an evaporation section, a condensation section and a connecting section connecting with the evaporation section and the condensation section. The evaporation section defines a plurality of dents at an outer wall thereof to increase rough degree of the outer wall of the evaporation section, to prevent solder from separation from the evaporation section during soldering process soldering the evaporation section to a heat sink. A method of manufacturing a heat pipe includes steps of: a) affording a straight heat pipe; b) bending the straight heat pipe to form a U-shaped heat pipe, wherein the U-shaped heat pipe has an evaporation section, a condensation section parallel to the evaporation section and a connecting section connecting with the evaporation section and the condensation section; c) affording a mold forming a plurality of protrusions at inner wall thereof; and d) clamping and pressing the evaporation section of the heat pipe by the mold to make the evaporation section round and form dents at its outer wall.

Other advantages and novel features of the present invention will become more apparent from the following detailed description when taken in conjunction with the accompanying drawings.

BRIEF DESCRIPTION OF THE DRAWINGS

Many aspects of the present heat pipe can be better understood with reference to the following drawings. The components in the drawings are not necessarily drawn to scale, the emphasis instead being placed upon clearly illustrating the principles of the present heat pipe. Moreover, in the drawings, like reference numerals designate corresponding parts throughout the several views.

DETAILED DESCRIPTION OF THE INVENTION

Figure 1:
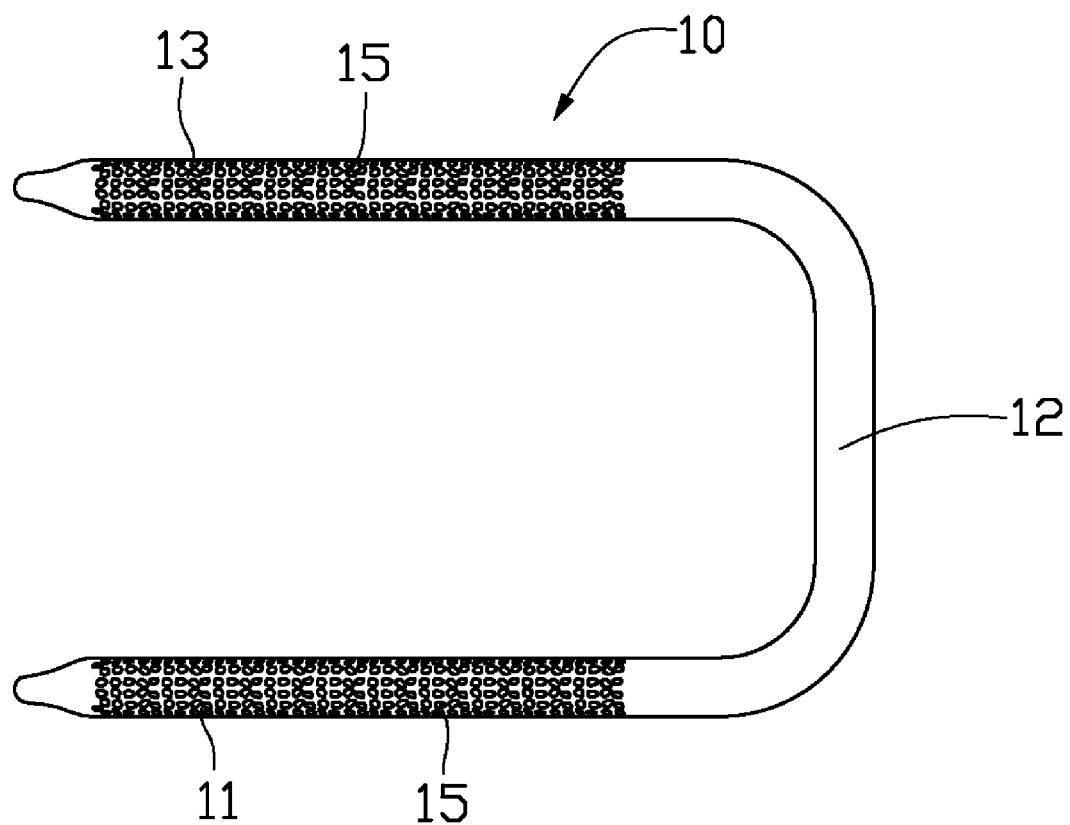
FIG. 1 is a schematic view of a heat pipe in accordance with a preferred embodiment of the present invention.

Referring to FIG. 1, a heat pipe 10 for being soldered to a heat sink (not shown) is provided for transferring heat from a portion of the heat sink to another portion of the heat sink. The heat pipe 10 is tubular and has a U-shaped configuration. The heat pipe 10 comprises an evaporation section 11, a condensation section 13 parallel to the evaporation section 11 and a connecting section 12 connecting the evaporation section 11 with the condensation section 13. The evaporation section 11 and the condensation section 13 define a plurality of dents 15 at outer walls thereof.

In this embodiment, the dents 15 are discrete and each have an approximately circular shape. The dents 15 each also can have a rectangular shape, triangular shape, or other shapes. In another embodiment, the dents 15 can be continuous to form concave threads, such as helical threads.

Figure 2:
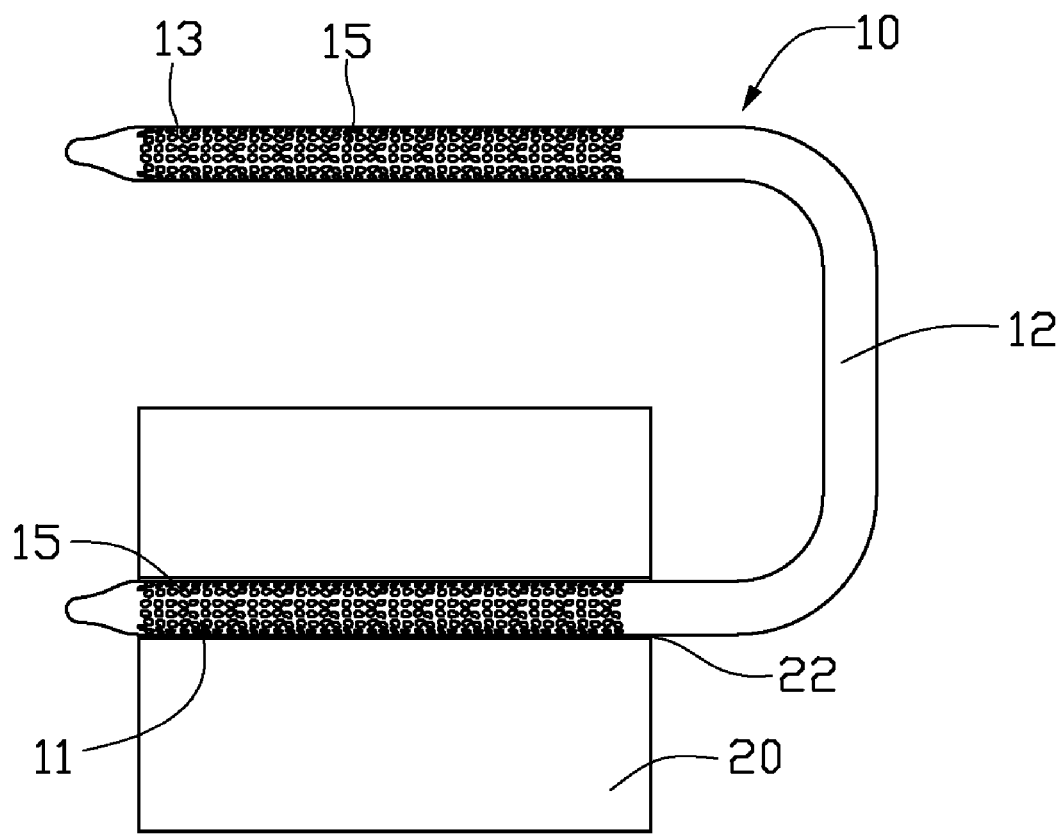
FIG. 2 is a schematically assembled view of the heat pipe and a heat spreader.

Referring to FIG. 2, the heat pipe 10 is soldered to a heat spreader 20 of the heat sink. The heat spreader 20 defines a groove 22 for thermally receiving the evaporation section 11 of the heat pipe 10. By the provision of the dents 15 of the heat pipe 10, surface roughness of the outer wall of the evaporation section 11 is increased. Thus, the molten solder can be easily adhered to the outer wall of the evaporation section 11 during soldering the evaporation section 11 of the heat pipe 10 in the groove 22 of the heat spreader 20 of the heat sink.

In assembly, the evaporation section 11 of the heat pipe 10 is positioned in the groove 22 of the heat spreader 20, wherein the outer wall of the evaporation section 11 of the heat pipe 10 has been coated with a layer of solder which fills in the dents 15. The heat pipe 10 and the heat spreader 20 are heated at a determined temperature to melt the solder so that a portion of the solder can flow into the groove 22. Then the heat pipe 10 and the heat spreader 20 are cooled to solidify the molten solder thereby soldering the heat pipe 10 onto the heat spreader 20. During the soldering process, the solder is still adhered to the outer wall of the evaporation section 11 due to the provision of the dents 15 to thereby prevent an undue separation of the solder from the evaporation section 11. Thus, the evaporation section 11 can have a firm connection with the heat spreader 20 and the heat sink accordingly has a good heat dissipation performance. Likewise, the outer wall of the condensation section 13 of the heat pipe 10 is coated with solder which fills in the dents 15; the condensation section 13 is inserted into fins (not shown) of the heat sink and is soldered to the fins by heating the fins and the condensation section 13.

Figure 3:
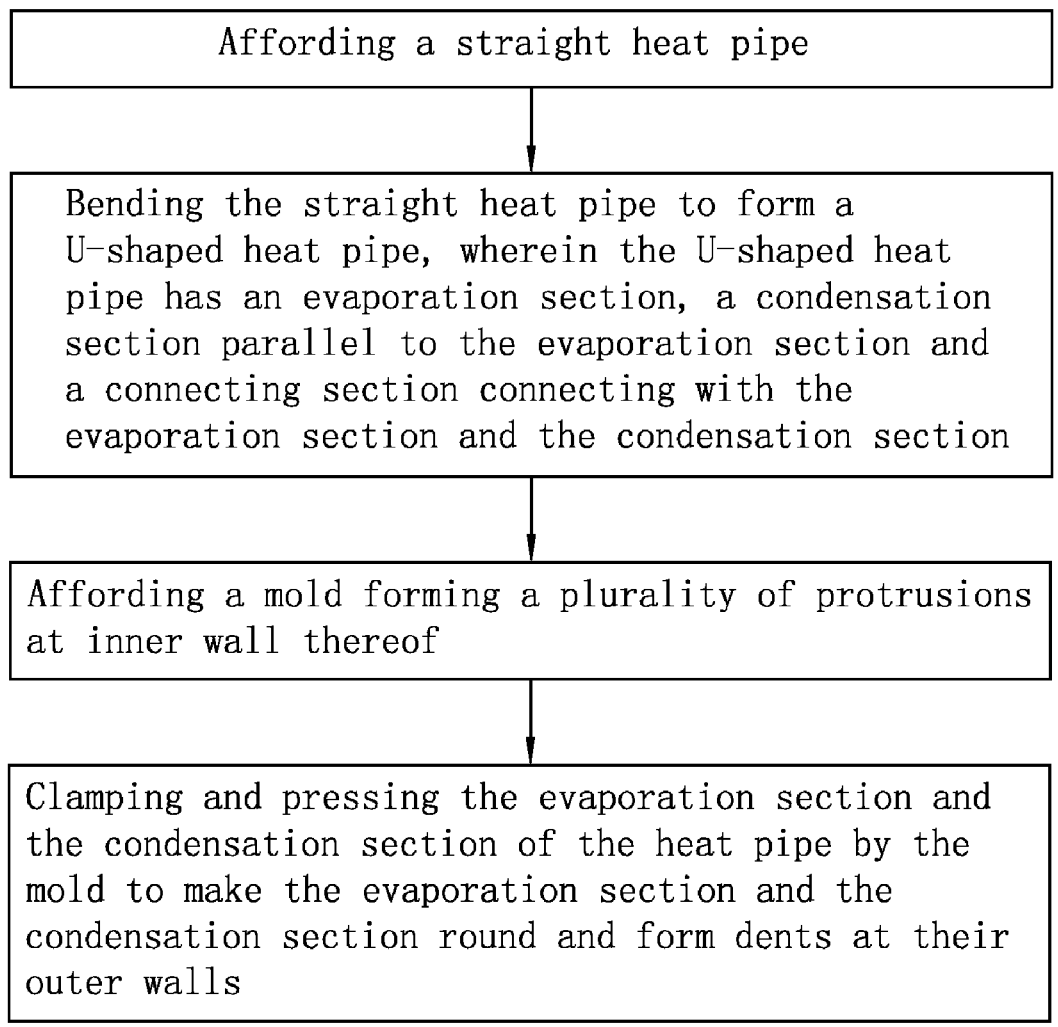
FIG. 3 is a block diagram showing steps of a method of manufacturing the heat pipe.

Referring to FIG. 3, a method of manufacturing the heat pipe 10 in accordance with the present invention comprises steps of:

a) affording a straight heat pipe with a round cross section;

b) bending the straight heat pipe to form the U-shaped heat pipe 10, which has the evaporation section 11, the condensation section 13 parallel to the evaporation section 11 and the connecting section 12 connecting with the evaporation section 11 and the condensation section 13, wherein a roundness of a cross section of the U-shaped heat pipe 10 is deformed due to the bending operation;

c) affording a mold forming a plurality of protrusions at an inner wall thereof, the inner wall defining a hole having a high degree of roundness and a diameter similar to that of the straight heat pipe; and d) clamping and finishing the evaporation section 11 and the condensation section 13 of the heat pipe 10 by the mold to make the evaporation section 11 and the condensation section 13 have a high degree of roundness meanwhile and form the dents 15 in the outer walls thereof.

The mold comprises an upper portion and a lower portion. Each of the upper and lower portions defines a groove having a shape corresponding to a shape of a half of the straight heat pipe. The protrusions are formed at portions of inner walls of the upper and lower portions of the mold defining the grooves, located corresponding to the evaporation section 11 and the condensation section 13. Thus, when the heat pipe 10 is sandwiched and clamped by the upper and lower portions of the mold, the dents 15 are formed at the outer walls of the evaporation section 11 and the condensation section 13 of the heat pipe 10, meanwhile a cross section of the heat pipe 10 can have a high degree of roundness.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method of manufacturing a heat pipe, the method comprising steps of:

a) affording a straight heat pipe;

b) bending the straight heat pipe to form a U-shaped heat pipe, wherein the U-shaped heat pipe has an evaporation section, a condensation section parallel to the evaporation section, and a connecting section connecting with the evaporation section and the condensation section;

c) affording a mold comprising a plurality of protrusions at an inner wall thereof; and d) clamping and pressing the evaporation section of the heat pipe by the mold to make the evaporation section round and form dents around the entire circumference of the heat pipe at an outer wall of the evaporation section.

2. The method as described in claim 1, wherein the condensation section of the heat pipe is also pressed and clamped by the mold to form dents at its outer wall at the step d).

3. The method as described in claim 1, wherein the mold comprises an upper portion and a lower portion for sandwiching the heat pipe.

4. The method as claimed in claim 1, wherein the protrusions of the mold directly extrude the outer wall of the evaporation section of the heat pipe to form the dents at the outer wall.

5. The method as claimed in claim 4, wherein the dents are discrete and each have an approximately circular shape.

6. A method for forming a heat pipe, the method comprising:

providing a straight heat pipe;

bending the straight heat pipe into a bent heat pipe;

affording a mold comprising a plurality of protrusions at an inner wall thereof; and processing the bent heat pipe by the mold to make a cross section of the bent heat pipe round and meanwhile the protrusions of the mold directly extrude at least a portion of an outer wall of the bent heat pipe to form dents around the entire circumference of the heat pipe therein, wherein the at least a portion of the outer wall of the bent heat pipe is adapted for being soldered to a heat sink.

7. The method as described in claim 6, wherein the bent heat pipe has a U-shaped configuration.

8. The method as described in claim 6, wherein the at least a portion of the outer wall of the bent heat pipe is one of an evaporation section and a condensation section of the bent heat pipe.

9. The method as claimed in claim 6, wherein the mold includes a first portion and a second portion, and the step of processing the bent heat pipe includes clamping the bent heat pipe between the first and second portions of the mold.

10. The method as claimed in claim 6, wherein the dents are discrete and each have an approximately circular shape.

11. A method for forming a heat pipe, the method comprising:

providing a straight heat pipe;

bending the straight heat pipe into a bent heat pipe;

processing the bent heat pipe by a mold to make a cross section of the bent heat pipe round and meanwhile at least a portion of an outer wall of the bent heat pipe is formed with dents around the entire circumference of the heat pipe therein, wherein the at least a portion of the outer wall of the bent heat pipe is adapted for being soldered to a heat sink; and wherein the at least a portion of the outer wall of the bent heat pipe is one of an evaporation section and a condensation section of the bent heat pipe.

* * * * *